(12) United States Patent
Biggs et al.

(10) Patent No.: US 8,248,750 B2
(45) Date of Patent: Aug. 21, 2012

(54) ELECTROACTIVE POLYMER TRANSDUCERS

(75) Inventors: Silmon James Biggs, Los Gatos, CA (US); Edward F. Johnson, Sunnyvale, CA (US); Gordon Russell, Redwood City, CA (US); Luther Lawford White, III, Union City, CA (US)

(73) Assignee: Bayer MaterialScience AG, Monheim (DE)

( * ) Notice: Subject to any disclaimer, the term of this patent is extended or adjusted under 35 U.S.C. 154(b) by 988 days.

(21) Appl. No.: 12/234,023

(22) Filed: Sep. 19, 2008

(65) Prior Publication Data
US 2009/0154053 A1    Jun. 18, 2009

Related U.S. Application Data

(63) Continuation-in-part of application No. 11/956,269, filed on Dec. 13, 2007, now Pat. No. 7,911,761.

(51) Int. Cl.
    *H01G 4/018*    (2006.01)
(52) U.S. Cl. ........ 361/273; 361/272; 361/277; 361/305; 361/321.5; 361/303; 310/363; 310/311
(58) Field of Classification Search ................. 361/273, 361/272, 277, 305, 321.5, 303; 310/363, 310/311
See application file for complete search history.

(56) References Cited

U.S. PATENT DOCUMENTS

| 6,856,305 B2* | 2/2005 | Nagano ........................ 345/60 |
| 6,891,317 B2* | 5/2005 | Pei et al. ....................... 310/328 |

* cited by examiner

*Primary Examiner* — Nguyen T Ha
*Assistant Examiner* — Hung Dang
(74) *Attorney, Agent, or Firm* — John E. Mrozinski, Jr.

(57) ABSTRACT

Dielectric elastomer or electroactive polymer film transducers configured to minimize high electrical field gradients that can lead to partial discharge and corona.

17 Claims, 8 Drawing Sheets

ELECTROACTIVE POLYMER TRANSDUCERS

CROSS-REFERENCE TO RELATED APPLICATIONS

The present application is a continuation-in-part of U.S. patent application Ser. No. 11/956,269, filed on Dec. 13, 2007, the content of which is incorporated herein by reference in its entirety

FIELD OF THE INVENTION

The present invention relates to dielectric elastomer or electroactive polymer film transducers and optimizing their performance by minimizing high electrical field gradients that can lead to partial discharge and corona.

BACKGROUND OF THE INVENTION

A tremendous variety of devices used today rely on actuators of one sort or another to convert electrical energy to mechanical energy. Conversely, many power generation applications operate by converting mechanical action into electrical energy. Employed to harvest mechanical energy in this fashion, the same type of actuator may be referred to as a generator. Likewise, when the structure is employed to convert physical stimulus such as vibration or pressure into an electrical signal for measurement purposes, it may be referred to as a sensor. Yet, the term "transducer" may be used to generically refer to any of the devices.

A number of design considerations favor the selection and use of advanced dielectric elastomer materials, also referred to as "electroactive polymers" (EAPs), for the fabrication of transducers. These considerations include potential force, power density, power conversion/consumption, size, weight, cost, response time, duty cycle, service requirements, environmental impact, etc. As such, in many applications, EAP technology offers an ideal replacement for piezoelectric, shape-memory alloy (SMA) and electromagnetic devices such as motors and solenoids.

An EAP transducer comprises two thin film electrodes having elastic characteristics and separated by a thin elastomeric dielectric material. When a voltage difference is applied to the electrodes, the oppositely-charged electrodes attract each other thereby compressing the polymer dielectric layer therebetween. As the electrodes are pulled closer together, the dielectric polymer film becomes thinner (the z-axis component contracts) as it expands in the planar directions (the x- and y-axes components expand).

Examples of EAP devices and their applications are described in U.S. Pat. Nos. 7,394,282; 7,378,783; 7,368,862; 7,362,032; 7,320,457; 7,259,503; 7,233,097; 7,224,106; 7,211,937; 7,199,501; 7,166,953; 7,064,472; 7,062,055; 7,052,594; 7,049,732; 7,034,432; 6,940,221; 6,911,764; 6,891,317; 6,882,086; 6,876,135; 6,812,624; 6,809,462; 6,806,621; 6,781,284; 6,768,246; 6,707,236; 6,664,718; 6,628,040; 6,586,859; 6,583,533; 6,545,384; 6,543,110; 6,376,971 and 6,343,129; and in U.S. Patent Application Publication Nos. 2008/0157631; 2008/0116764; 2008/0022517; 2007/0230222; 2007/0200468; 2007/0200467; 2007/0200466; 2007/0200457; 2007/0200454; 2007/0200453; 2007/0170822; 2006/0238079; 2006/0208610; 2006/0208609; and 2005/0157893, the entireties of which are incorporated herein by reference.

Many EAP transducer operate at high voltages, e.g., in the range from about 0.5 kV to about 50 kV. Like any high voltage device, EAP transducers are susceptible to partial discharge. Energy moves from a region of high electrical potential to a region of lower electrical potential, e.g., from the high voltage electrode to the ground electrode. A partial discharge occurs when a small quantity of charge (i.e., picoCoulombs) does not bridge the entire space between the electrodes. Areas of steep gradients in electrical potential favor partial discharges. These include electrode edges, projections extending from an electrode, cracks internal to the electrode, and gas filled microvoids within the dielectric material. Generally, the smaller the radius of curvature of the electrode geometry, the lower the voltage necessary to initiate and maintain partial discharge. Put another way, the smoother the electrode surfaces, the less likely partial discharge will occur.

Partial discharges through air are particularly damaging to dielectric elastomer transducers. The discharge may be from the electrode into the air, which serves as a virtual ground—a phenomenon commonly called "corona discharge." Alternately, the charge may pass though the air as it jumps from the electrode to an adjacent region of the dielectric surface. In either case, movement of the charge through air is energetic, producing fluorescence, ionized gas, and temperatures within the arc on the order of thousands of degrees Celsius. The ionized gas reacts to produce corrosive materials like ozone and nitrogen oxides that yield nitric acid under conditions of high humidity. These reactive species, in combination with the high temperatures present within the electrical arc, erode the electrode and dielectric materials and can shorten the life span of a transducer.

The inventors of the subject invention are not aware of any prior art dielectric elastomer/electroactive polymer transducers that are designed to inhibit or suppress partial discharge and corona. Thus, it would be highly advantageous to fabricate and provide EAP transducers having such a feature.

SUMMARY OF THE INVENTION

The present invention provides EAP films, transducer films and transducers configured or designed to suppress or minimize partial discharge, and methods of fabricating such transducers. These films are fabricated in part by coating or encapsulating at least a portion of the film with a partial discharge suppressant for a purpose of excluding air to minimize the corona effect and/or reducing the high concentration of electrical stress gradients and thereby minimize degradation of the dielectric by partial discharge.

Generally, the partial discharge suppressant or partial discharge suppressing material, also referred to interchangeably herein as an encapsulent or coating, is placed in regions of the film having a steep electrical gradient thereby distributing the electrical field and minimizing the electrical stress at one or more locations or regions of the film.

The subject films may be employed as transducers for application in actuators, generators, sensors, and the like, or as components thereof.

These and other features, objects and advantages of the invention will become apparent to those persons skilled in the art upon reading the details of the invention as more fully described below.

BRIEF DESCRIPTION OF THE DRAWINGS

The invention is best understood from the following detailed description when read in conjunction with the accompanying schematic drawings, where variation of the invention from that shown in the figures is contemplated. To facilitate understanding of the invention description, the same reference numerals have been used (where practical) to designate similar elements that are common to the drawings. Where cross-sectional views are provided (FIGS. 2B-7B), those views are taken along the line B-B in corresponding top views (FIGS. 2A-7A). Included in the drawings are the following figures.

DETAILED DESCRIPTION OF THE INVENTION

Before describing particular embodiments of the materials, devices and systems of the present invention, a discussion of compliant electroactive capacitive structures and their material properties and performance characteristics is provided.

Figure 1A:
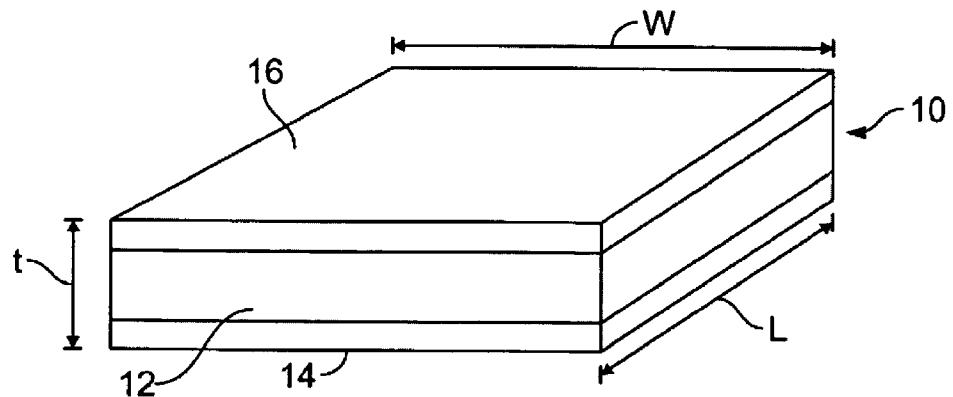
FIGS. 1A and 1B illustrate a top perspective view of a transducer before and after application of a voltage in accordance with one embodiment of the present invention.
Figure 1B:
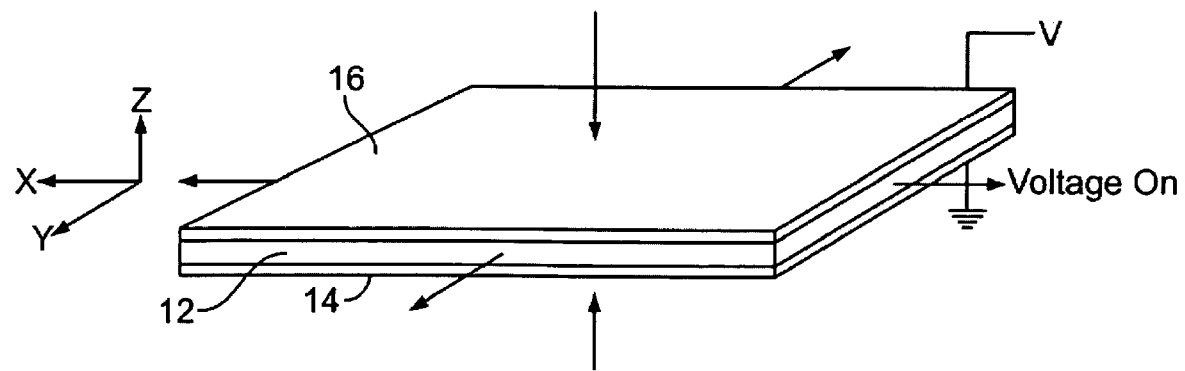

FIGS. 1A and 1B illustrate a capacitive structure in the form of an electroactive film or membrane 10. A thin elastomeric dielectric film or layer 12 is sandwiched between compliant or stretchable electrode plates or layers 14 and 16, thereby forming a capacitive structure or film. The length "l" and width "w" of the dielectric layer, as well as that of the composite structure, are much greater than its thickness "t". Typically, the dielectric layer has a thickness in range from about 10 µm to about 100 µm, with the total thickness of the structure in the range from about 25 µm to about 10 cm. Additionally, it is desirable if possible to select the elastic modulus, thickness, and/or the microgeometry of electrodes 14, 16 such that the additional stiffness they contribute to the actuator is generally less than the stiffness of the dielectric layer 12, which has a relatively low modulus of elasticity, i.e., less than about 100 MPa and more typically less than about 10 MPa, but is likely thicker than each of the electrodes. Electrodes suitable for use with these compliant capacitive structures are those capable of withstanding cyclic strains greater than 1% without failure due to mechanical fatigue.

As seen in FIG. 1B, when a voltage is applied across the electrodes, the unlike charges in the two electrodes 14, 16 are attracted to each other and these electrostatic attractive forces compress the dielectric film 12 (along the Z-axis). The dielectric film 12 is thereby caused to deflect with a change in electric field. As electrodes 14, 16 are compliant, they change shape with dielectric layer 12. Generally speaking, deflection refers to any displacement, expansion, contraction, torsion, linear or area strain, or any other deformation of a portion of dielectric film 12. Depending on the form fit architecture, e.g., a frame, in which capacitive structure 10 is employed (collectively referred to as a "transducer"), this deflection may be used to produce mechanical work. Various different transducer architectures are disclosed and described in the above-identified patent references.

With a voltage applied, the transducer film 10 continues to deflect until mechanical forces balance the electrostatic forces driving the deflection. The mechanical forces include elastic restoring forces of the dielectric layer 12, the compliance or stretching of the electrodes 14, 16 and any external resistance provided by a device and/or load coupled to transducer 10. The resultant deflection of the transducer 10 as a result of the applied voltage may also depend on a number of other factors such as the dielectric constant of the elastomeric material and its size and stiffness. Removal of the voltage difference and the induced charge causes the reverse effects.

In some cases, the electrodes 14 and 16 may cover a limited portion of dielectric film 12 relative to the total area of the film. This may be done to prevent electrical breakdown around the edge of the dielectric or achieve customized deflections in certain portions thereof. Dielectric material outside an active area (the latter being a portion of the dielectric material having sufficient electrostatic force to enable deflection of that portion) may be caused to act as an external spring force on the active area during deflection. More specifically, material outside the active area may resist active area deflection by its contraction or expansion.

The dielectric film 12 may be pre-strained. The pre-strain improves conversion between electrical and mechanical energy, i.e., the pre-strain allows the dielectric film 12 to deflect more and provide greater mechanical work. Pre-strain of a film may be described as the change in dimension in a direction after pre-straining relative to the dimension in that direction before pre-straining. The pre-strain may comprise elastic deformation of the dielectric film and be formed, for example, by stretching the film in tension and fixing one or more of the edges while stretched. The pre-strain may be imposed at the boundaries of the film using a rigid frame or may be implemented for only a portion of the film.

The transducer structure of FIGS. 1A and 1B and other similar compliant structures and the details of their constructs are more fully described in many of the above-referenced patents and publications.

The present invention provides EAP films, transducer films and transducers configured or designed to suppress or minimize partial discharge, and methods of fabricating such transducers. These EAP transducers are fabricated in part by coating or encapsulating at least a portion of the EAP film forming the transducer with a partial discharge suppressant for a purpose of excluding air to minimize the corona effect and thereby minimize degradation of the dielectric by partial discharge.

Generally, the partial discharge suppressant or partial discharge suppressing material, also referred to interchangeably herein as an encapsulent or coating, is placed in regions of the film having a steep electrical gradient, e.g., at the edges of the electrode material, thereby distributing the electrical field and minimizing the electrical stress at one or more locations or regions of the film. The suppressant material may cover the entirety of the electrodes forming the EAP film or portions thereof, e.g., just the edges of the electrode material. The suppressant material may be provided as an outer layer on one or both sides of the EAP film, or may be interposed between the electrodes and the dielectric material. Additionally, the coating or encapsulation material may cover the entirety or a portion of the dielectric material forming the EAP film. Alternatively, the coating or encapsulation may cover dielectric material only and not any portion of the electrodes. Still yet, the entirety of the electrode and dielectric materials may be coated with the suppressant material. Optionally, coatings, particularly those having a high dielectric breakdown strength, may be partially impregnated into the dielectric and/or electrode materials, for example by migration of a transformer-grade dielectric oil from the encapsulant into the underlying dielectric.

FIGS. 2-7 illustrate variety of exemplary configurations of EAP transducer films designed for partial discharge suppression wherein a partial discharge suppressing material, encapsulent or conformal coating is applied to the EAP film according to the present invention. The EAP film of each of these figures includes a dielectric elastomer layer 22 disposed between top and bottom electrodes 24a, 24b. The encapsulent/coating covers at least a portion of the actuating surface of one or both electrodes and/or the edges of the electrode material. Each electrode has a radially extending tab 26 (viewable from the respective top views) which is not encapsulated or coated in order to enable electrical connection of the transducer to a power supply (not illustrated). For clarity of illustration, the frame members that hold the transducer EAP films are not illustrated in the figures.

Figure 2A:
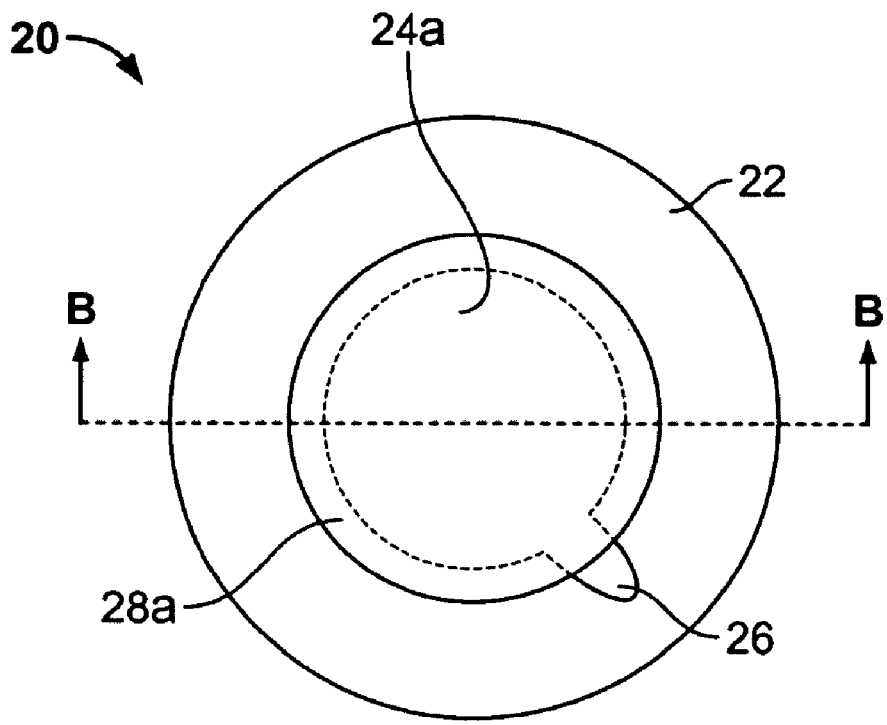
FIGS. 2A and 2B are top and cross-sectional views, respectively, of an EAP film for use in the subject transducers having a partial discharge suppressant covering the entirety of the exposed or outwardly facing portions of the electrodes and a portion of the dielectric elastomer.
Figure 2B:
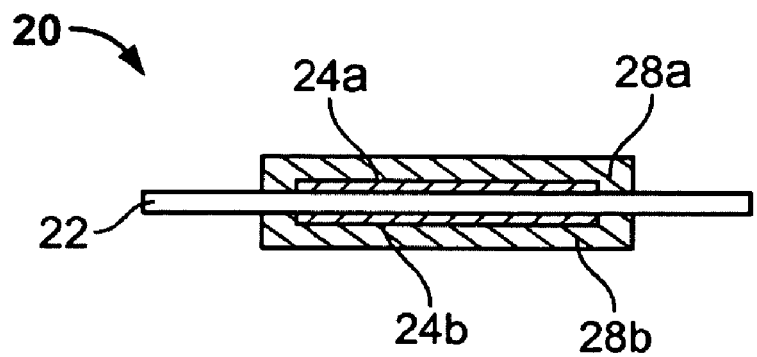

FIGS. 2A and 2B illustrate a transducer film 20 encapsulated/coated on both sides with encapsulent/coating 28a, 28b. The encapsulant material covers the entirety of the exposed or outwardly facing electrode surfaces 24a, 24b (except for the electrode tabs 26) and a portion of both sides of dielectric elastomer 22, i.e., the encapsulent provides a partial outer layer on both sides of the transducer film. Full encapsulation is suitable for suppressing partial discharges at the electrode edges, and also suppressing discharges which may occur at imperfections within the body of the electrode (e.g., at cracks, pits, inclusions of dust, etc.). Furthermore, a full coating provides some protection to electrodes that are vulnerable to corrosion in air (e.g., thin film metals), and provides a layer of electrical insulation that, if adequately thick and robust, may make the device suitable for direct human contact in the absence of other packaging.

Figure 3A:
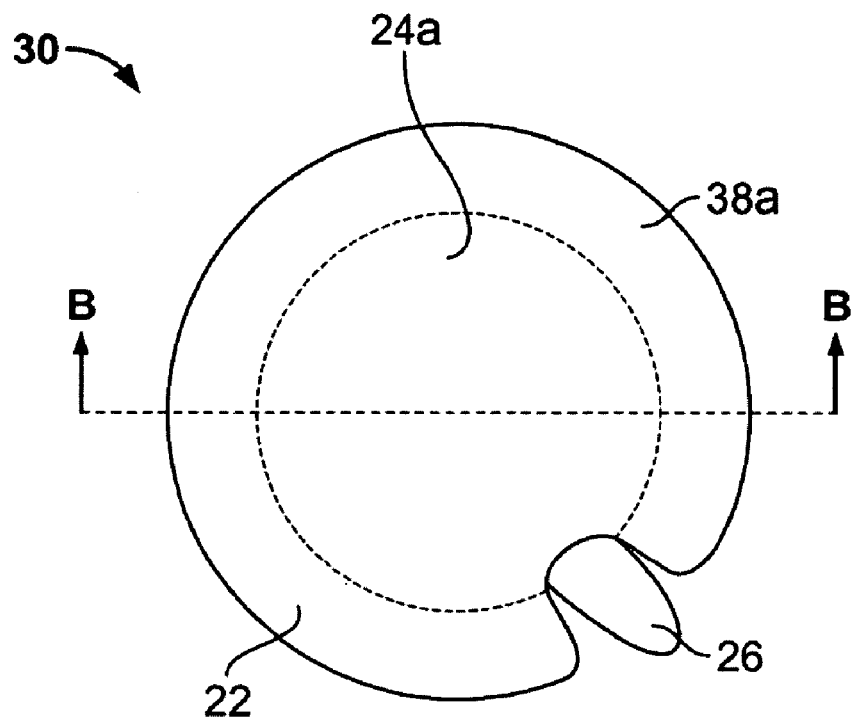
FIGS. 3A and 3B are top and cross-sectional views, respectively, of an EAP film for use in the subject transducers having a partial discharge suppressant covering the entirety of the exposed or outwardly facing portions of the electrodes and dielectric elastomer.
Figure 3B:
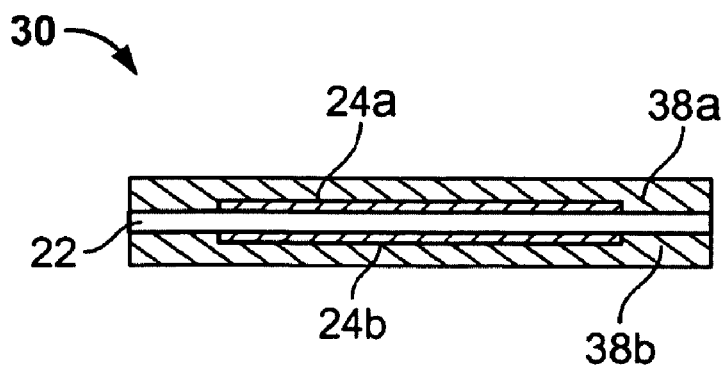

FIGS. 3A and 3B illustrate a transducer film 30 with the entirety of both electrodes 24a, 24b and the entirety of both sides of dielectric elastomer 22 encapsulated/coated with encapsulent/coating 38a, 38b, i.e., the encapsulent provides a complete outer layer over the transducer film. This variation provides the potential added benefit of hermetically sealing the transducer.

Figure 4A:
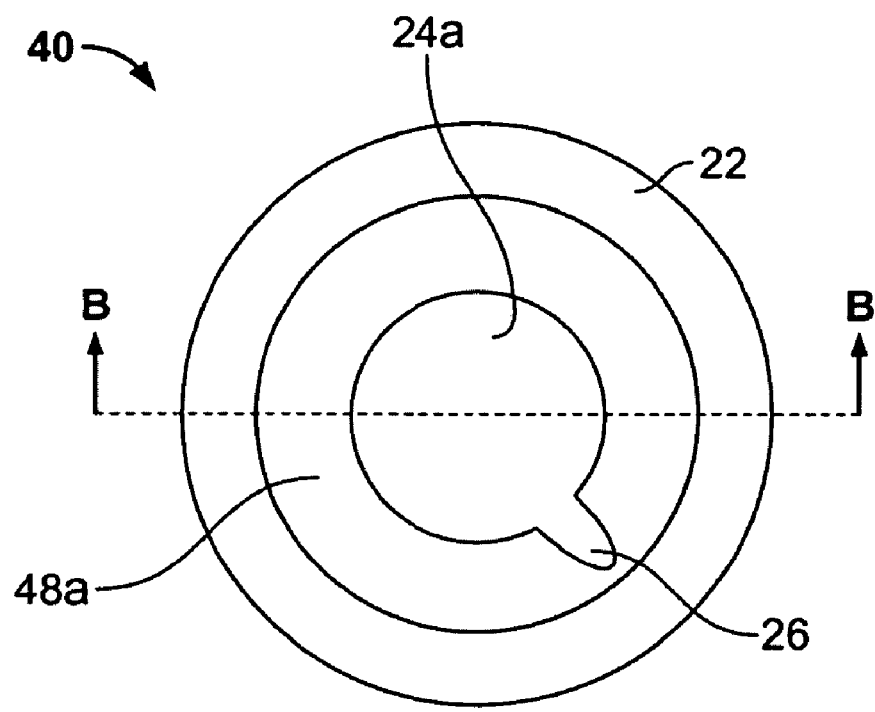
FIGS. 4A and 4B are top and cross-sectional views, respectively, of an EAP film for use in the subject transducers having a partial discharge suppressant disposed between the dielectric material and the electrodes, thereby covering a substantial portion of both sides of the dielectric elastomer material.
Figure 4B:
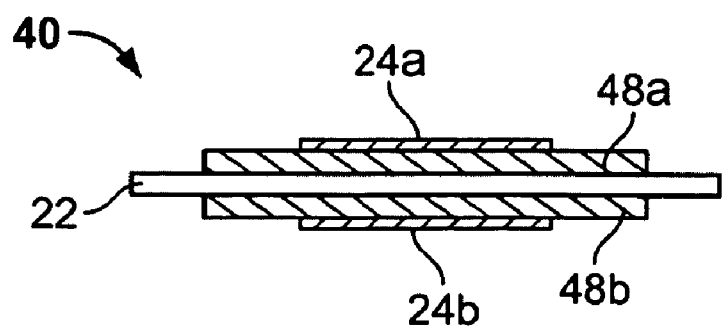

FIGS. 4A and 4B illustrate a transducer film 40 with a substantial portion of both sides of dielectric elastomer 22 covered by encapsulant/coating 48a, 48b without any exposed or outwardly facing portion of the electrodes 24a, 24b being encapsulated or coated. Rather, a primer layer of encapsulant lies between one or both electrodes, i.e., is in contact with the inwardly facing side of the electrodes, and a surface of the dielectric layer. Optionally, a layer of encapsulant/coating may also be applied on top of the electrode material on one or both sides of film 40. This configuration has the benefit of making the dielectric surface more uniform. This may be accomplished by first dipping the dielectric layer in the coating prior to adding the electrode material and, optionally, a top layer of coating. If the primer layer is sufficiently thin, (e.g., about one-tenth of the dielectric thickness), then it can be stiffer than the dielectric, thus acting as a mechanical stress grading between the soft dielectric and relatively stiffer electrode. A mechanical stress grading can be useful for metal electrodes, since it spatially low-pass filters stress concentrations that can crack the metal. Alternately, if the primer layer is a material with good stress grading properties, i.e., having a dielectric constant greater than about 3 and having a resistivity in the range of about 1E6 to about 1E13 ohm-m, then it can serve the function of an electrical stress grading.

Figure 5A:
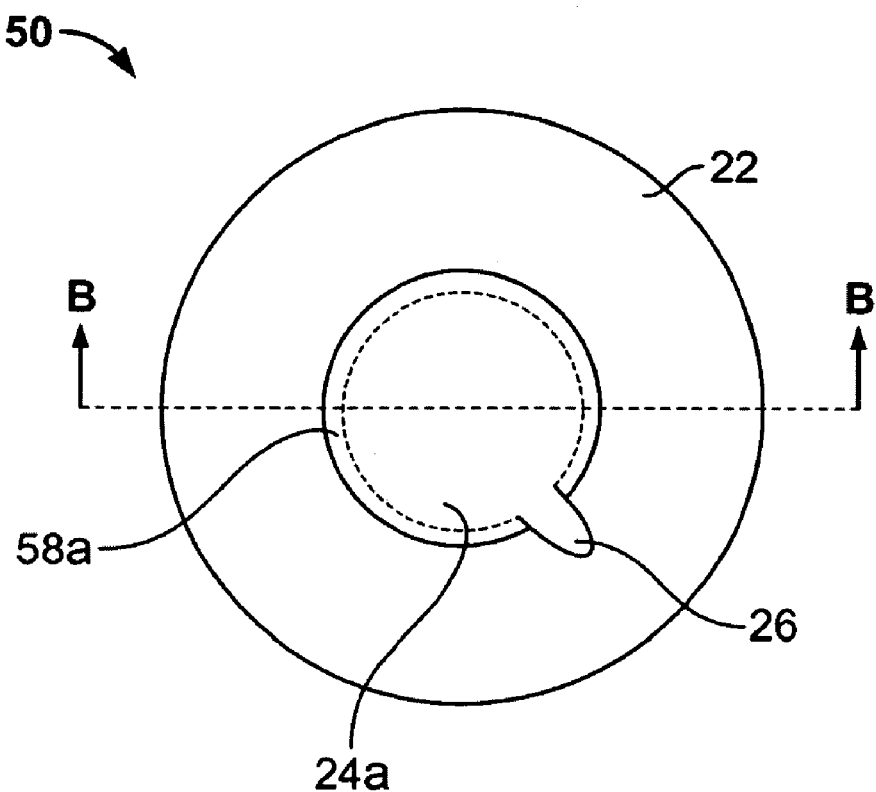
FIGS. 5A and 5B are top and cross-sectional views, respectively, of an EAP film for use in the subject transducers with a partial discharge suppressant covering the entirety of the exposed or outwardly facing sides of the electrodes and at least a minimal portion of the dielectric elastomer in order to bridge across the edges of the electrodes.
Figure 5B:
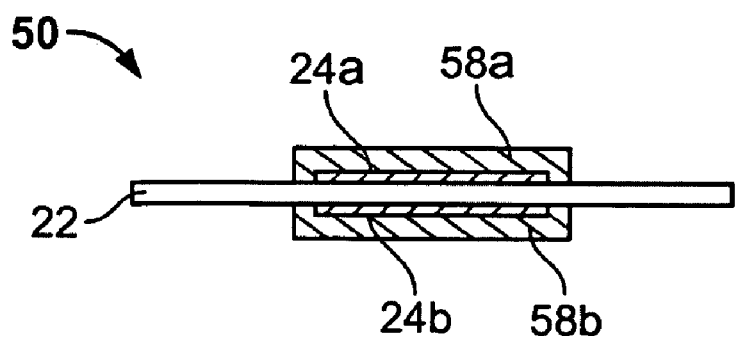

FIGS. 5A and 5B illustrate a transducer film 50 with the entirety of the electrodes 24a, 24b encapsulated/coated with partial discharge suppressant 58a, 58b and at least a minimal portion of the dielectric elastomer 22 in order to bridge across the edges of the electrodes. This variation is well-suited for encapsulents which tend to migrate and interfere with adhesion of rigid components to the dielectric, e.g., encapsulents containing oil. An encapsulate-free zone between the active region and stiffening components on the device perimeter insures adequate adhesion of other components, for example a frame (not pictured in the diagram), that is attached away from the encapsulated area, beyond the area affected by oil migration.

Figure 6A:
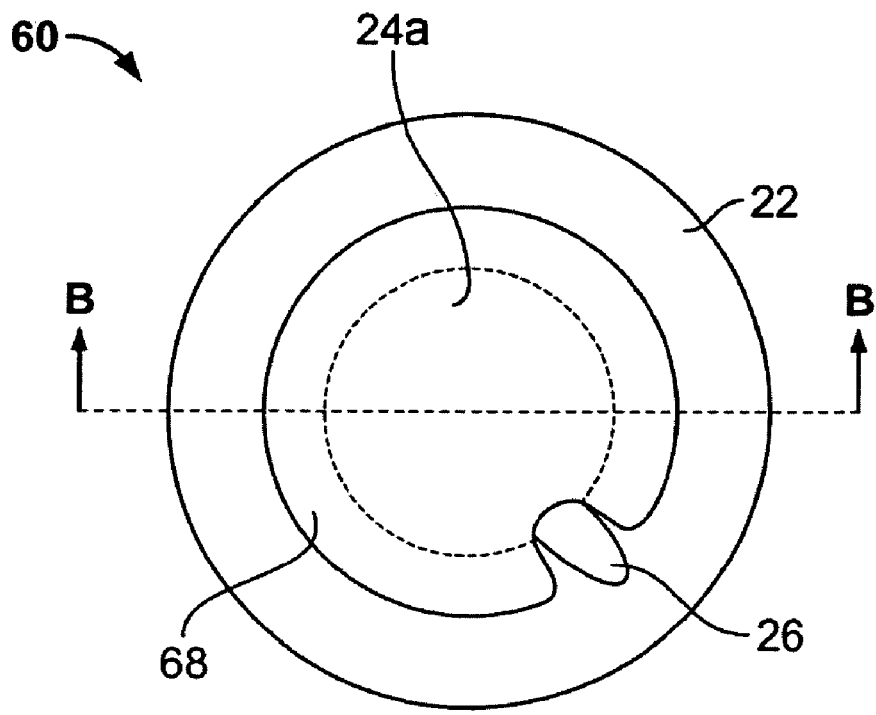
FIGS. 6A and 6B are top and cross-sectional views, respectively, of an EAP film for use in the subject transducers having a partial discharge suppressant covering the entirety of the exposed or outwardly facing side of the top electrode and a portion of the top side of the dielectric elastomer but not any portion of the bottom side of the EAP film.
Figure 6B:
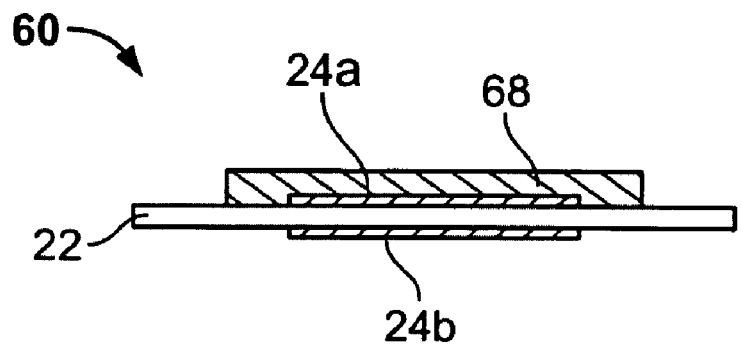

FIGS. 6A and 6B 5B illustrate a transducer film 60 with the entirety of the outward-facing side of top electrode 24a and a portion of the top side of the dielectric elastomer 22 being encapsulated/coated with partial discharge suppressant 68 without any portion of the bottom side of the EAP film being encapsulated or coated. While the unencapsulated/uncoated side of the EAP film may be subject to partial discharge, encapsulating/coating only one side of the EAP film is easier than encapsulating/coating both sides, requiring fewer steps and less time. Additionally, a one-sided encapsulated film is less likely to have its compliancy and flexibility inhibited.

Figure 7A:
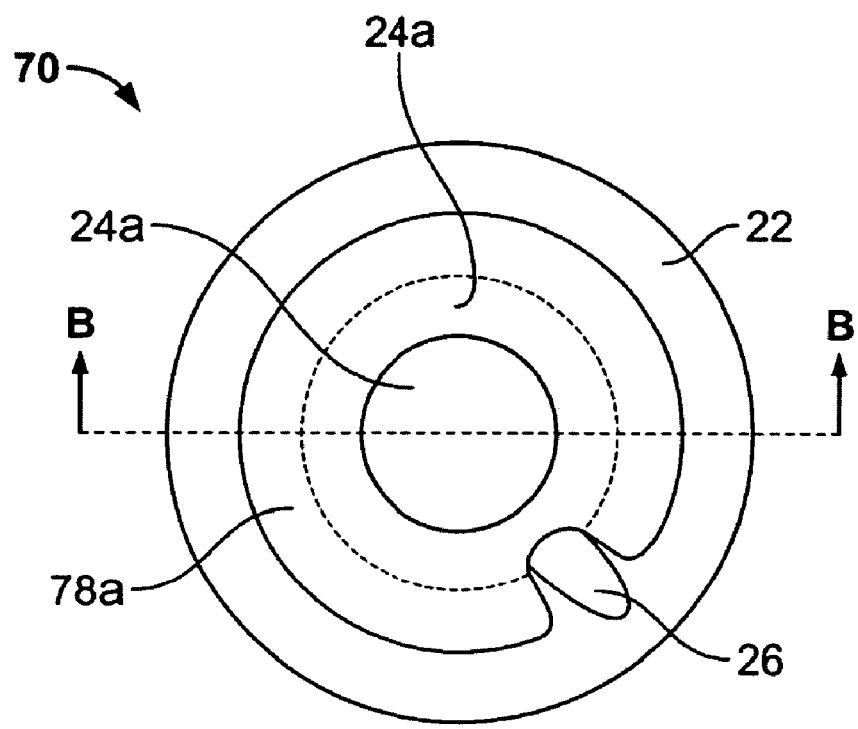
FIGS. 7A and 7B are top and cross-sectional views, respectively, of an EAP film for use in the subject transducers having a partial discharge suppressant covering only the edges of the electrodes and a relatively small portion of both sides of the dielectric elastomer.
Figure 7B:
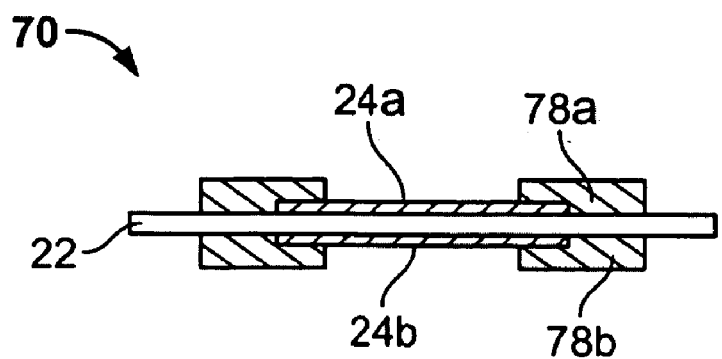

FIGS. 7A and 7B 5B illustrate a transducer film 70 with only the edges of the electrodes 24a, 24b encapsulated/coated with partial discharge suppressant 78a, 78b and only a minimal portion of the exposed dielectric elastomer 22 being encapsulated/coated. This design adds no parasitic stiffness to most of the active area, but does suppress partial discharges at the electrode edge. This approach is suitable for electrodes that are relatively free of imperfections within the active area.

In other embodiments of the subject transducer films, the EAP film provides more than one active area or a plurality of active areas where each active area has at least two electrodes on a dielectric elastomer. Each active area either deflects in response to a change in electric field provided by the electrodes of the respective active area or causes a change in electric field in response to deflection of the respective active area. In these transducer embodiments, one or more of the active areas may also employ an encapsulate material in any electrode-dielectric-encapsulate arrangement or configuration of the present invention.

Because EAP transducers films are highly compliant and stretchable, the coating/encapsulation material must be compliant as well, i.e., have a minimum linear strain greater than about 5%, and add relatively little stiffness to the electroactive polymer film such that the displacement of the transducer diaphragm is not impeded. As such, the encapsulent material, when coated at the desired thickness, should have a spring constant at least as low as that of the dielectric. A low modulus encapsulant adds little stiffness, even when coated as a relatively thick layer, facilitating defect-free manufacturing. To this end, it is desirable to use an encapsulant with an elastic modulus at least as low as that of the dielectric material. In many applications, the elastic modulus of the coating is typically less than about 1 MPa, e.g., a PDMS gel with low cross linking. In applications where the desired mechanical response is primarily viscous, the coating essentially has an elastic modulus of zero, e.g., high molecular weight PDMS grease.

Suitable coating/encapsulation materials for the present invention include but are not limited to low-modulus solids, viscoelastic gels, and dielectric liquids, optionally filled with particulates that raise dielectric constant and/or lower resistivity. Examples of suitable low modulus solids include poly (dimethylsiloxane) (PDMS), styrene-ethylene/butylene-styrene block copolymer (SEBS), polyurethane (PU), poly(n-butyl acrylate), poly(isobutene). The modulus of these solids can be lowered further by reducing the cross link density, or by adding a compatible dielectric liquid to form a viscoelastic gel. Suitable dielectric liquids include, for example, PDMS oils and mineral oils. It is also possible to use a completely un-crosslinked dielectric liquid when it is sufficiently viscous (e.g., long-chain PDMS grease), or is filled with enough particulates to make a paste.

Even without the addition of any fillers, the partial discharge suppressant comprised of polymer and/or dielectric liquid will have a dielectric constant ($\in$) greater than that of air ($\in_{AIR} \cong 1.0$). High dielectric constant is desirable, because raising the dielectric constant of material near the electrode edge makes the gradient in the electric field less steep, thus reducing the tendency of charge to jump from the electrode. Unfilled polymers typically have dielectric constants=$\cong$2.5 to 4.5), whereas filled polymers can have dielectric constants=$\cong$5 to 200). The coating also preferably has a resistivity in the range of semiconducting to insulating, or about 1E5 to about 1E14 $\Omega \cdot m$. The dielectric constant of the coating material may be raised, for example, by incorporating particles of a material with higher dielectric constant such as titanium dioxide, barium titanate, zinc oxide, aluminum oxide, silicon carbide, etc. In a similar way, the conductivity of the substantially non-conductive coating can be raised to a desired value by the addition of particles that are conducting, (e.g., carbon black, nanotubes, PEDOT, PANI, metal flakes, etc.) or semiconducting, (e.g., silicon, silicon carbide, etc.).

In some constructions, particularly those in which subsequent packaging of the EAP transducer substantially retards ingress of water vapor and oxygen, it is desirable to add fillers to the encapsulant layer to sequester water vapor or oxygen that remains in the package after assembly. Suitable fillers for scavenging water vapor include molecular sieves 4A, silica gel, montmorillonite clay, zeolites etc. Suitable fillers for scavenging oxygen include, for instance, Fe powder, sodium sulfite, butylated hydroxytoluene, and butylated hydroxyanisole.

The processes and techniques for fabricating the subject EAP films and transducers may vary greatly given the broad range of transducer designs and applications, with a wide range of electrode, dielectric and partial discharge suppressing materials to choose from.

Figure 8:
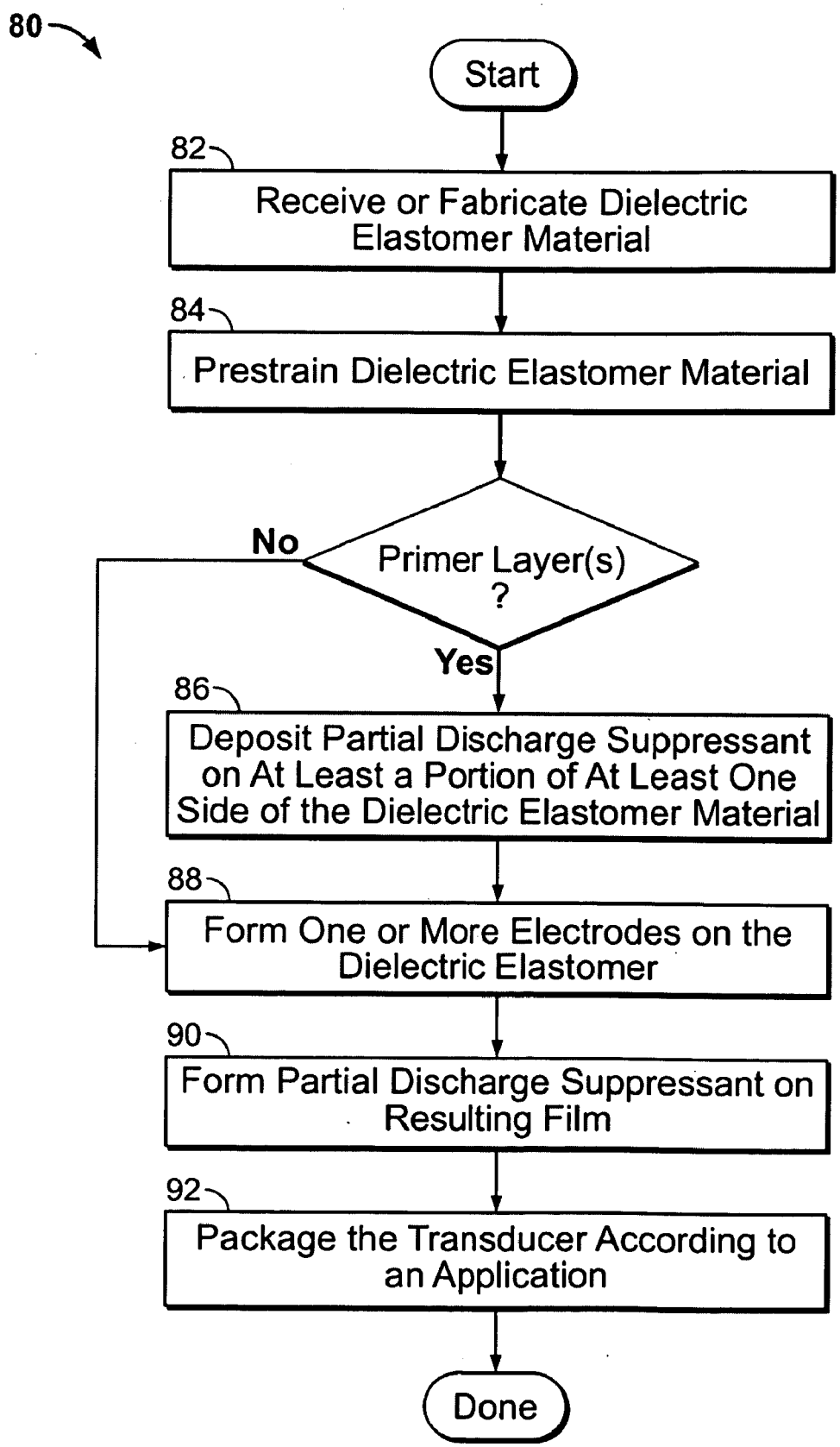
FIG. 8 illustrates a process flow for fabricating an EAP transducer having a partial discharge suppressant in accordance with the present invention.

The transducers of the present invention may be fabricated in whole or in part by batch processing and/or continuous web fabrication techniques by which the transducers are provided individually or in a planar array. FIG. 8 illustrates a process flow 80 for fabricating an EAP device having at least one dielectric elastomer layer in accordance with one fabrication method of the present invention. Processes in accordance with the present invention may include up to several additional steps not described or illustrated herein. In some cases, fabrication processes of the present invention may include conventional materials and techniques such as commercially available dielectric elastomer and electrode materials as well as techniques used in fabrication of microelectronics and electronics technologies.

The process flow 80 begins by providing, receiving or fabricating a dielectric elastomer (82). The dielectric elastomer may be provided or fabricated according to several methods. In one embodiment, the dielectric elastomer is a commercially available product such as a commercially available silicone or acrylic elastomer film. In other embodiments, the dielectric elastomer is a film produced by coating, casting, dipping or spraying techniques. Roll-to-roll or web-based coating, for example, involves forming a layer of uncured polymer on a rigid carrier coated with a release agent. Typical coating processes (e.g., reverse roll, knife, slot-die, curtain, etc.) produce films in the range of about 10 to about 100 microns thick, which are cured by passage through a tunnel oven. The polymer film may then be released by mechanical peeling. Preferably, the dielectric elastomer is produced while minimizing variations in thickness or any other defects that may compromise the maximum electric field that can be applied across the dielectric elastomer and thus compromise performance.

As mentioned previously, the dielectric material may be pre-strained in one or more directions (84). In one embodiment, pre-strain is achieved by mechanically stretching a polymer in or more directions and fixing it to one or more solid members (e.g., rigid plates) while strained. Another technique for maintaining pre-strain includes the use of one or more stiffeners. The stiffeners are long rigid structures placed on a polymer while it is in a stretched state. The stiffeners maintain the pre-strain along their axis. The stiffeners may be arranged in parallel or other configurations to achieve directional compliance of the transducer. It should be noted that the increased stiffness along the stiffener axis comprises the increased stiffness provided by the stiffener material as well as the increased stiffness of the polymer in the pre-strain direction.

Surfaces on the pre-strained dielectric material may be textured to provide directional compliance of the material. In general, a textured surface may comprise any uniform (e.g., corrugated) or non-uniform (e.g., roughened) surface topography that allows a polymer to deflect in the desired direction. One manner of providing texturing is to stretch the polymer material more than it can stretch when actuated and then depositing a thin layer of stiff material on the stretched polymer surface. The stiff material, for example, may be a polymer which is cured after deposition. Upon relaxing, the composite structure buckles to provide the textured surface. The thickness of the stiff material may be altered to provide texturing on any scale, including submicrometer levels. In another embodiment, textured surfaces are produced by reactive ion etching (RIE).

In certain transducer film embodiments it is desirable to provide a primer layer of partial discharge suppressant, such as the film embodiment of FIGS. 4A and 4B. With these embodiments, the partial discharge suppressant is deposited (86) prior to providing the electrode material (88). If no primer layer is used, then one or more electrodes are formed directly on the dielectric material (88). If the dielectric has been textured or corrugated, one or more thin layers of suitable metal (e.g., chromium, aluminum, indium, tin, silver, gold, etc.) may be sputter deposited on the surface to provide a textured electrode. In another embodiment, carbon-filled electrodes may be patterned and deposited using a suitable process such as stenciling, screen-printing, pad-printing, flexographic printing, etc.

For transducer film embodiments such as those of FIGS. 2A/B, 3A/B, 5A/B, 6A/B and 7A/B, a layer of partial discharge suppressant is then deposited over a portion or substantially the entire electroactive polymer surface (88), except for the electrode contact(s) 26. Suitable suppressant application/coating methods include but are not limited to stenciling, spraying, dip-coating, screen-printing, pad-printing, flexographic printing, knife-overcoating, meter-rod coating, etc., followed by a curing step. To minimize voids in the encapsulent, it is desirable to de-gas the encapsulent before coating, and to apply it in a way that minimizes entrapped air.

Rigid frames, rigid members or other electrical and mechanical connectors, depending on the transducer application, are attached to the EAP film either before or after deposition of the electrode material to form the transducer structure (step not illustrated). The transducer, comprising one or more EAP film layers, is then packaged or configured within a selected form factor (90), e.g., for operation as an actuator, generator, sensor, etc. Packaging may also include assembly of multiple transducers mechanically linked or stacked as multiple layers. Packaging may also include assembly of a barrier layer that encloses the transducers in a space with an inert atmosphere (e.g., $N_2$, $SF_6$, He, Ne, Ar), or include a desiccant air that has been modified by incorporating a particulate solid, i.e., desiccant, within the package or within the encapsulant itself. Such desiccant materials may comprise a chemically reactive complexing agent such as Fe powder for $O_2$ scavenging, silica for $H_2O$ scavenging, etc. The material may be a molecular sieve or zeolite. Alternatively, included particulate may be a blowing agent, such as Calogen or Safoam that generates $CO_2$ (see, e.g., U.S. Pat. No. 7,314,895, incorporated herein by reference), $N_2$, or other gases), and/or humidity buffers such as acrylamide gels (see, e.g., WO 1991/000316, incorporated herein by reference).

Although fabrication of subject EAP transducers and transducer films has been briefly described with respect to a few specific examples, fabrication processes and techniques of the present invention may vary accordingly for any the actuators or applications described above. For example, the process for fabricating a diaphragm actuator in accordance with a specific embodiment may include adding some stiffening packaging components before formation of the electrode (86). Likewise, deposition of the metal electrode in a stretched state may provide a corrugated texture to the dielectric/electrode interface, so that steps (84) and (86) are combined.

As for other details of the present invention, materials and alternate related configurations may be employed as within the level of those with skill in the relevant art. The same may hold true with respect to method-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth n the claims. For example, adding a fastener or boss, complex surface geometry or another feature to a "transducer" as presented in the claims shall not avoid the claim term from reading on accused structure. Stated otherwise, unless specifically defined herein, all technical and scientific terms used herein are to be given as broad a commonly understood meaning as possible while maintaining claim validity.

In all, the breadth of the present invention is not to be limited by the examples provided.

That being said, we claim:

1. A transducer film comprising:
a dielectric elastomer material having a modulus of elasticity less than about 100 MPa;
an electrode material on at least one side of the dielectric elastomer material; and
a partial discharge suppressant in contact with at least a portion of at least one of the dielectric elastomer material or the electrode material, the partial discharge suppressant having a dielectric constant greater than that of air and a modulus of elasticity no greater than that of the dielectric elastomer.

2. The transducer film of claim 1, wherein the partial discharge suppressant contacts only electrode material.

3. The transducer film of claim 1, wherein the partial discharge suppressant is in contact with an outwardly facing portion of the electrode material.

4. The transducer film of claim 1, wherein the partial discharge suppressant is in contact with an inwardly facing portion of the electrode material.

5. The transducer film of claim 1, wherein the partial discharge suppressant is in contact with only the dielectric elastomer material.

6. The transducer film of claim 1, wherein the partial discharge suppressant is in contact with an outwardly facing portion of the dielectric elastomer material.

7. The transducer film of claim 1, wherein the partial discharge suppressant is in contact with an inwardly facing portion of the dielectric elastomer material.

8. The transducer film of claim 7, wherein the partial discharge suppressant lies between the dielectric elastomer material and the electrode material.

9. The transducer film of claim 1, wherein the partial discharge suppressant is in contact with at least a portion of the dielectric elastomer material and at least a portion of the electrode material.

10. The transducer film of claim 1, wherein electrode material is on both sides of the dielectric elastomer material, and wherein the extent of contact of the partial discharge suppressant is substantially the same on both sides of the dielectric elastomer material.

11. The transducer film of claim 1, wherein electrode material is on both sides of the dielectric elastomer material, and wherein the extent of contact of partial discharge suppressant is different on each side of the dielectric elastomer material.

12. The transducer film of claim 1, wherein the partial discharge suppressant comprises one or more of a low-modulus solid, viscoelastic gel and dielectric liquid.

13. The transducer film of claim 1, wherein the partial discharge suppressant comprises particulates that do one or more of raise the dielectric constant, lower the resistivity of the suppressant, scavenge water vapor and scavenge oxygen.

14. The transducer film of claim 1, wherein the partial discharge suppressant has a minimum linear strain greater than about 5%.

15. The transducer film of claim 1, wherein the elastic modulus of the partial discharge suppressant is less than about 1 MPa.

16. The transducer film of claim 1, wherein the resistivity of the partial discharge suppressant is in the range from about 1E5 to about 1E14 □m.

17. A transducer device comprising the transducer film of claim 1.

* * * * *